United States Patent
Ono et al.

(10) Patent No.: US 7,844,934 B2
(45) Date of Patent: Nov. 30, 2010

(54) METHOD FOR DESIGNING A SEMICONDUCTOR INTEGRATED CIRCUIT LAYOUT CAPABLE OF REDUCING THE PROCESSING TIME FOR OPTICAL PROXIMITY EFFECT CORRECTION

(75) Inventors: Yusaku Ono, Tokyo (JP); Osamu Suga, Tokyo (JP); Kazuyuki Sakata, Tokyo (JP); Hirofumi Taguchi, Osaka (JP); Yushi Okuno, Kanagawa (JP); Toshiaki Sugioka, Kanagawa (JP); Daisuke Kondo, Kawasaki (JP)

(73) Assignees: Renesas Electronics Corporation, Kawasaki-Shi, Kanagawa (JP); Panasonic Corporation, Kodami-Shi, Osaka (JP); Fujitsu Microelectronics Limited, Shinjuku-Ku, Tokyo (JP); Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 11/486,107

(22) Filed: Jul. 14, 2006

(65) Prior Publication Data

US 2007/0124714 A1   May 31, 2007

(30) Foreign Application Priority Data

Jul. 14, 2005   (JP) .............................. 2005-205117

(51) Int. Cl.
*G06F 17/50* (2006.01)
*G06F 9/45* (2006.01)

(52) U.S. Cl. .................... 716/10; 716/8; 716/9; 716/11; 716/12; 716/13; 716/14; 716/19; 716/20; 716/21; 430/5; 430/30

(58) Field of Classification Search .................. 716/4, 716/5, 8–14, 19–21; 430/5, 30
See application file for complete search history.

(56) References Cited

U.S. PATENT DOCUMENTS

| | | | | |
|---|---|---|---|---|
| 5,838,581 A | * | 11/1998 | Kuroda | ......................... 716/8 |
| 6,680,539 B2 | * | 1/2004 | Nohsoh et al. | ............... 257/758 |
| 7,208,350 B2 | * | 4/2007 | Kawashima et al. | ........ 438/129 |
| 2002/0100005 A1 | | 7/2002 | Anderson et al. | |
| 2003/0229479 A1 | * | 12/2003 | Smith et al. | ................... 703/14 |
| 2004/0098674 A1 | * | 5/2004 | Vuong et al. | ................... 716/1 |
| 2004/0230769 A1 | * | 11/2004 | Kawashima et al. | ........... 712/1 |

FOREIGN PATENT DOCUMENTS

| | | |
|---|---|---|
| JP | 2001-156072 A | 6/2001 |
| JP | 2004-288685 A | 10/2004 |

* cited by examiner

*Primary Examiner*—Nghia M Doan
(74) *Attorney, Agent, or Firm*—Buchanan Ingersoll & Rooney, P.C.

(57) ABSTRACT

According to the present invention, a method for designing a semiconductor integrated circuit layout comprises the steps of: arranging basic logic cells which are circuit patterns corresponding to logic components of a semiconductor integrated circuit; arranging wiring between the basic logic cells; searching for a blank area in which none of the basic logic cells is arranged; extracting a rectangular region from the blank area; if the rectangular region is larger than a specified size, arranging fill cells in the rectangular region according to a predetermined rule and grouping the fill cells into pseudo-hierarchical cells according to a predetermined rule to form a hierarchy; arranging fill cells in the remaining blank areas; and performing optical proximity effect correction on the semiconductor integrated circuit pattern.

8 Claims, 16 Drawing Sheets fill cell A fill cell B pseudo-hierarchical cell A0 pseudo-hierarchical cell A0 pseudo-hierarchical cell A1 pseudo-hierarchical cell A2 pseudo-hierarchical cell A3 pseudo-hierarchical cell A4 pseudo-hierarchical cell B0 pseudo-hierarchical cell B1 pseudo-hierarchical cell B2 pseudo-hierarchical cell B3 pseudo-hierarchical cell B4 pseudo-hierarchical cell A3

METHOD FOR DESIGNING A SEMICONDUCTOR INTEGRATED CIRCUIT LAYOUT CAPABLE OF REDUCING THE PROCESSING TIME FOR OPTICAL PROXIMITY EFFECT CORRECTION

This Application claims priority of Japanese Patent Application No. 2005-205117 filed on Jul. 14, 2005, the disclosure of which is incorporated herein in its entirety by reference.

BACKGROUND OF THE INVENTION

1. Field of the Invention

The present invention relates to a method for designing a semiconductor integrated circuit layout, capable of reducing the processing time for optical proximity effect correction.

2. Background Art

Since its invention, the semiconductor integrated circuit (IC) has been continually improved by technological advances. For instance, the circuit has become more and more miniaturized to achieve enhanced performance and functions, as well as reduced cost. Miniaturization requires an improvement on the lithographic technique for forming a micropattern. According to the Rayleigh criterion, a lithographic resolution, or a resolution pitch (RP), is expressed by the following equation:

$$RP = k1 \times \lambda / NA,$$

where k1 is a constant of proportionality, λ is the wavelength of the exposure light, and NA is the numerical aperture of the lens.

In recent years, efforts have been made to reduce the k1 factor by use of a super resolution technique, etc. in order to meet the demand for miniaturized design. However, although reducing the k1 factor results in an increase in the resolution, the following problems arise: (1) an increase in the two-dimensional distortion of the pattern (that is, a degradation in the fidelity); and (2) a reduction in the process margins.

A technique called optical proximity effect correction (OPC) has been used to overcome these problems. There are two major types of OPC: (1) rule-based OPC and (2) model-based OPC. In rule-based OPC, each pattern is corrected according to a predetermined rule (regarding the pattern width, pitch, etc.) In model-based OPC, on the other hand, a simulation is performed to predict the accuracy and fidelity of the patterns to be formed and correct them. In recent years, it has become difficult to describe, or correct, patterns by means of rule-based OPC, since their distortion has been increased as a result of miniaturization, which leads to complicated OPC specifications. Therefore, model-based OPC has become commonly used for pattern correction. However, since the model-based OPC employs simulation, it requires a longer processing time than the rule-based OPC.

The miniaturization of semiconductor integrated circuits has also lead to an increase in the circuit design scale and integration density, dramatically increasing the number of figures or symbols included in a chip pattern. This has also contributed greatly to an increase in the OPC processing time, since the OPC processing time is generally proportional to the number of figures processed.

In pattern layout design, blank areas that have not been filled with intended patterns are filled with dummy patterns, which have no circuit functions. These dummy patterns are provided to improve the manufacturing process and serve the following purposes: (1) improve lithographic margins; (2) prevent the loading effect in the etching process; and (3) improve the flatness in the CMP process.

The underlying dummy pattern for a field, gate pattern, etc. is referred to as a "fill cell" or "filler cell" and usually stored in the cell library. Various methods for arranging fill cells have been proposed (see, e.g., Japanese Patent Laid-open No. 2004-288685). Since basic logic cells are arranged according to how they are connected to one another, the blank areas formed as a result of such arrangement are irregular in size and position. This means that different numbers and types of fill cells may be required to fill different blank areas. That is, the fill cell arrangement varies from one blank area to another, and, furthermore, fill cells are arranged irregularly within each blank area. When fill cells are arranged irregularly, it is difficult to establish pseudo-hierarchical cells, which are used to speed up the OPC processing, as described below.

A pseudo-hierarchical cell is an imaginary cell made up of a plurality of actual cells or cell groups (or pseudo-hierarchical cells) having the same cell configuration. Pseudo-hierarchical cells and actual cells may form a hierarchy. FIGS. 29 to 31 show exemplary layouts, and FIG. 32 shows a hierarchical structure formed based on these layouts. The cell C shown in FIG. 31 is made up of cells A and B such as those shown in FIGS. 29 and 30. For example, dimensions of the cell C are checked using the following sequential steps: checking the widths (or dimensions) of the cells A and B on the left-hand side of FIG. 31; checking the width (or dimensions) of the overlap 103 between these cells A and B; and checking the width (or dimensions) of the overlap 104 between the cells A and B on the right-hand side of FIG. 31. It should be noted that the widths of the cells A and B on the right-hand side are not checked, since the cells A and B on the left-hand side have been checked.

On the other hand, FIG. 33 shows a layout in which actual cells are grouped into pseudo-hierarchical cells, and FIG. 34 shows a hierarchical structure formed based on this layout. Specifically, referring to FIG. 33, since the cells A and B on the right- and left-hand sides are arranged in exactly the same way, they are respectively grouped together to generate pseudo-hierarchical cells V. In this case, dimensions of the cell C are checked using the following sequential steps: checking the widths (or dimensions) of the cells A and B in the cell V on the left-hand side of FIG. 33; and checking the width (or dimensions) of the overlap between these cells A and B. It should be noted that the dimensions of the cell V on the right-hand side are not checked, since the cell V on the left-hand side have been checked.

Thus, when no pseudo-hierarchical cells are generated, 4 width check (or dimensional check) operations must be performed. With pseudo-hierarchical cells, on the other hand, only 3 width check (or dimensional check) operations need be performed, thus speeding up the processing. It should be noted that the time required to generate the pseudo-hierarchical cells must be shorter than that required to complete a single width check operation. In the case of a general large-scale layout, a width check operation takes a sufficiently longer time to complete, since it requires graphics processing.

The cells A and B within each cell V may be expanded, or broken down, when the pseudo-hierarchical cells are generated before checking the width of each cell. This eliminates the need for checking the width of each cell within each cell V, separately, and hence there is no need for checking the width of the overlap between the cells A and B, thus further speeding up the processing. FIG. 35 shows the hierarchical structure in such a case. Thus, generation of pseudo-hierarchical cells and expansion of cells allow reducing the numbers of cell figures and areas to be processed, leading to reduced processing time for optical proximity effect correction.

There will now be described a conventional method for designing a semiconductor integrated circuit layout. FIG. 36 shows a flowchart illustrating the conventional method for designing a semiconductor integrated circuit layout. First, at step S1, basic logic cells 100 are arranged based on cell library information and circuit information corresponding to a net list of the semiconductor integrated circuit, as shown in FIG. 37. It should be noted that FIG. 37 only shows the outline of each cell and does not show its inside layout.

Then, at step S2, wiring is arranged between the arranged basic logic cells based on circuit connection information included in data for automatic arrangement/wiring. Then, at step S3, fill cells 101 and 102 are arranged in the blank areas, in which no basic logic cells are arranged, as shown in FIG. 38. Then, the layout is checked at step S4, and it is determined at step S5 whether there is an error in the layout. If no, optical proximity effect correction is performed at step S6. If yes, then processing returns to step S1 at which basic logic cells are arranged.

The following is a description of a conventional method for arranging fill cells in each blank area. For example, the blank areas are filled with fill cells sequentially from the leftmost blank area to the rightmost blank area regardless of the size and shape of each blank area. Further, within each blank area, fill cells are arranged from left to right. Specifically, first, large fill cells (such as the fill cell 101 in FIG. 38) are arranged in each blank area. (These fill cells have a size equal to the largest size available that fits in the blank area.) Then, if there remains any unfilled space in this blank area, smaller fill cells (such as the fill cell 102 in FIG. 38) are arranged in this unfilled space. (These smaller fill cells have a size equal to the largest size available that fits in the space.) This is repeated until the entire blank area is filled with fill cells. The above processing is repeated for all blank areas. However, this conventional method has a problem in that in the resultant layout, fill cells of different sizes are arranged at random, as shown in FIG. 38. Specifically, some pseudo-hierarchical cells may be able to be generated in the X-direction. In the Y-direction, however, it is impossible to generate any pseudo-hierarchical cell, since fill cells of different sizes are arranged irregularly. Therefore, the conventional method cannot properly establish a pseudo-hierarchy, resulting in an increase in the processing time for optical proximity effect correction.

SUMMARY OF THE INVENTION

The present invention has been devised to solve the above problems. It is, therefore, an object of the present invention to provide a method for designing a semiconductor integrated circuit layout, capable of reducing the processing time for optical proximity effect correction.

According to one aspect of the present invention, a method for designing a semiconductor integrated circuit layout comprises the steps of: arranging basic logic cells which are circuit patterns corresponding to logic components of a semiconductor integrated circuit; arranging wiring between the basic logic cells; searching for a blank area in which none of the basic logic cells is arranged; extracting a rectangular region from the blank area; if the rectangular region is larger than a specified size, arranging fill cells in the rectangular region according to a predetermined rule and grouping the fill cells into pseudo-hierarchical cells according to a predetermined rule to form a hierarchy; arranging fill cells in the remaining blank areas; and performing optical proximity effect correction on the semiconductor integrated circuit pattern.

The present invention allows the processing time for optical proximity effect correction to be reduced.

DETAILED DESCRIPTION OF THE PREFERRED EMBODIMENTS

First Embodiment

Figure 1:
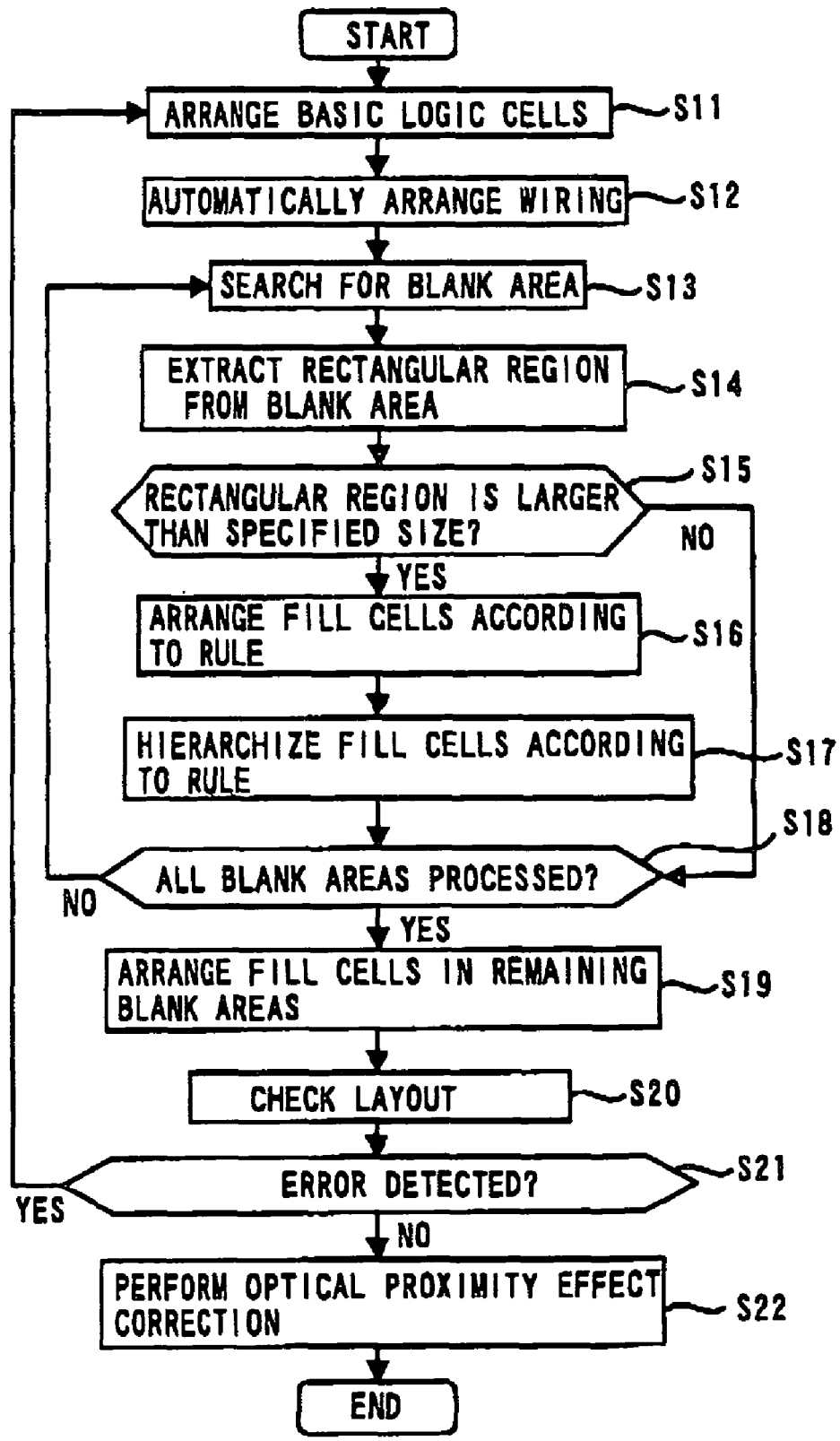
FIG. 1 shows a flowchart illustrating a method for designing a semiconductor integrated circuit layout according to a first embodiment of the present invention.
Figure 2:
FIG. 2 shows a layout in which basic logic cells are arranged.

FIG. 1 shows a flowchart illustrating a method for designing a semiconductor integrated circuit layout according to a first embodiment of the present invention. First, at step S11, basic logic cells 100, which are circuit patterns corresponding to logic components of the semiconductor integrated circuit, are arranged based on cell library information and circuit information corresponding to a net list of the semiconductor integrated circuit, as shown in FIG. 2.

Then, at step S12, wiring is automatically arranged between the arranged basic logic cells based on circuit connection information included in data for automatic arrangement/wiring. Then, at step S13, the entire layout area is scanned to find a blank area, in which no basic logic cells are arranged.

Figure 3:
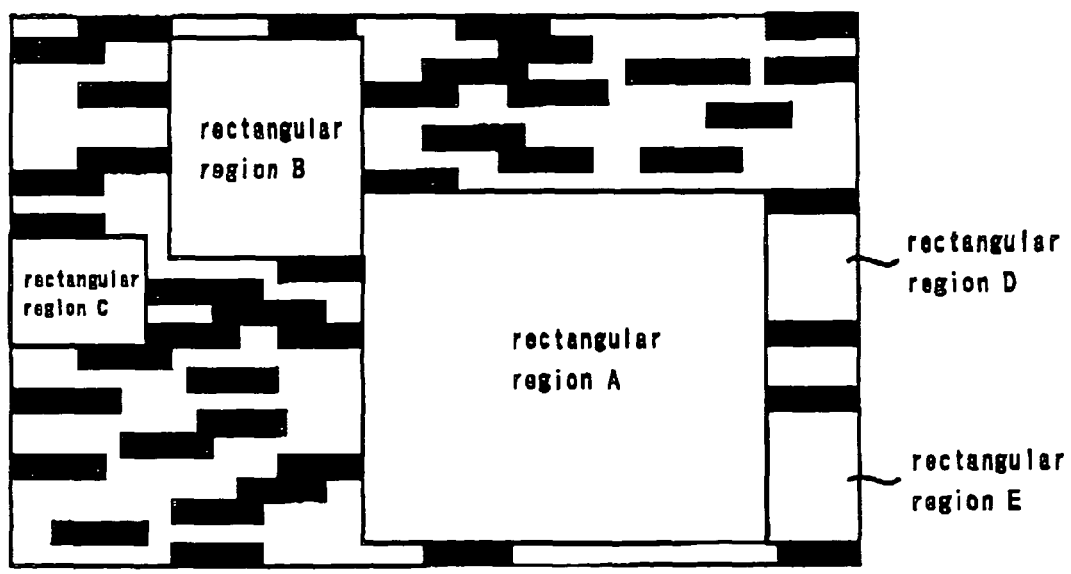
FIG. 3 shows a layout in which rectangular regions are extracted from blank areas.

Then, a rectangular region is extracted from the found blank area at step S14. For example, the rectangular region A shown in FIG. 3 may be extracted. The extracted rectangular region must be such that: its size is equal to an integer multiple of the size of a fill cell that fits in the rectangular region; and two or more such fill cells can be arranged in both the X- and Y-direction.

Then, at stop S15, it is determined whether the extracted rectangular region is larger than a specified size expressed in terms of area, the number of cells, etc. If there is no specification of such a size, then it is determined whether the rectangular region is large enough to accommodate at least two smallest-size fill cells in both the X- and Y-directions. If the decision from step S15 is yes, processing proceeds to step S16. If no, processing jumps to step S18.

Figure 4:
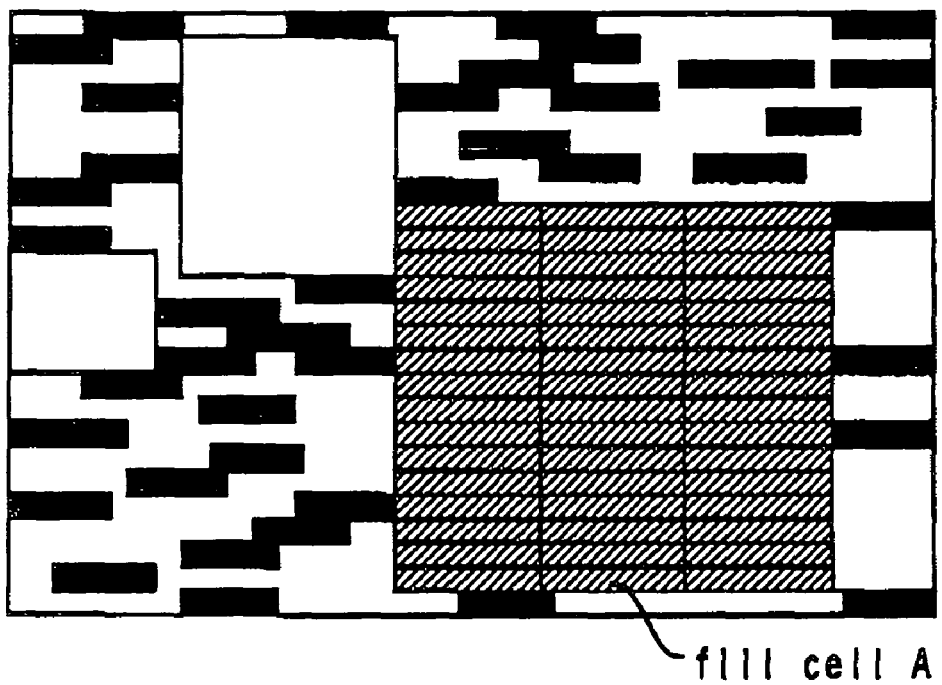
FIG. 4 shows a layout in which fill cells A are arranged in a grid within a rectangular region A.

If the rectangular region is determined to be larger than the specified size, that is, the decision from step S15 is yes, then fill cells are arranged in the rectangular region according to a predetermined rule at step S16. For example, these fill cells have a size equal to the largest size available that fits in the rectangular region A and are arranged in a grid within the rectangular region A, as shown in FIG. 4.

Figure 5:
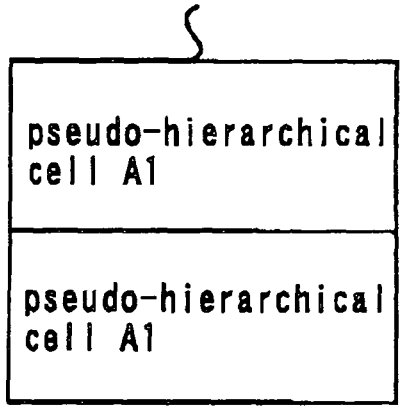
FIG. 5 shows a layout of a pseudo-hierarchical cell A0.
Figure 6:
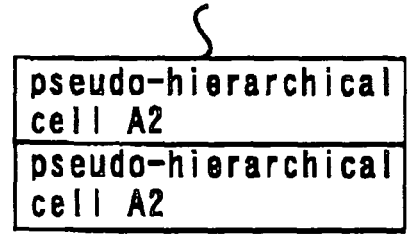
FIG. 6 shows a layout of a pseudo-hierarchical cell A1.
Figure 7:
FIG. 7 shows a layout of a pseudo-hierarchical cell A2.
Figure 8:
FIG. 8 shows a layout of a pseudo-hierarchical cell A3.
Figure 9:
FIG. 9 shows a layout of a pseudo-hierarchical cell A4.

Then, the arranged fill cells are grouped into pseudo-hierarchical cells to form a hierarchy at step S17. For example, fill cells arranged in the X-direction and those arranged in the Y-direction are grouped into pseudo-hierarchical cells, separately. Specifically, a top-level pseudo-hierarchical cell A0 is made up of two pseudo-hierarchical cells A1 arranged in the Y-direction, as shown in FIG. 5. Further, each pseudo-hierarchical cell A1 is made up of two pseudo-hierarchical cells A2 arranged in the Y-direction, as shown in FIG. 6. Further, each pseudo-hierarchical cell A2 is made up of two pseudo-hierarchical cells A3 arranged in the Y-direction, as shown in FIG. 7. Still further, each pseudo-hierarchical cell A3 is made up of two pseudo-hierarchical cells A4 arranged in the Y-direction, as shown in FIG. 8. Lastly, each bottom-level pseudo-hierarchical cell A4 is made up of three fill cells A arranged in the X-direction, as shown in FIG. 9.

Figure 10:
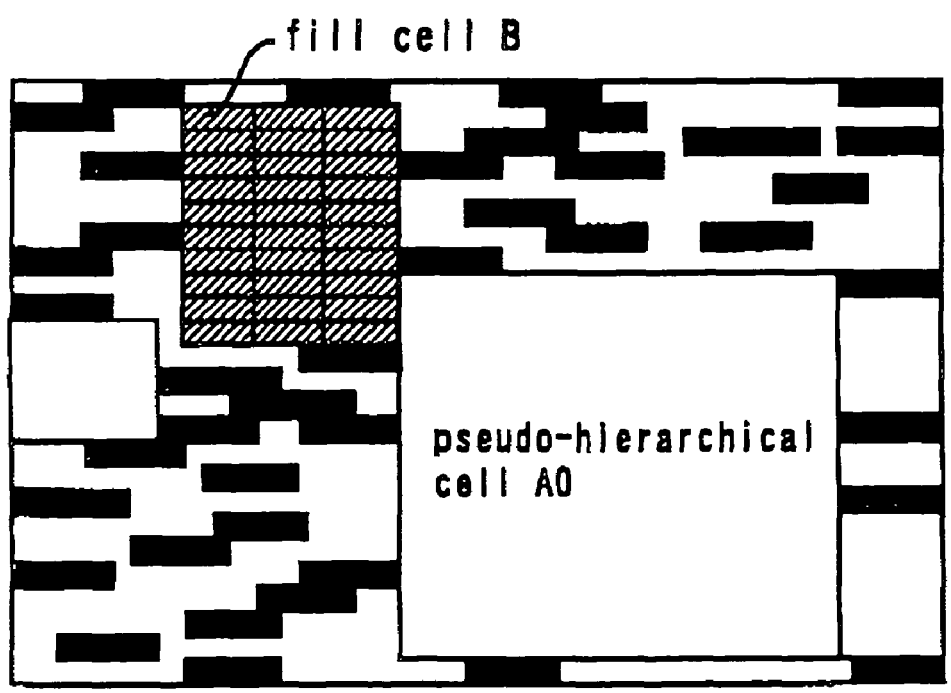
FIG. 10 shows a layout in which fill cells B are arranged in a grid within the rectangular region B.
Figure 11:
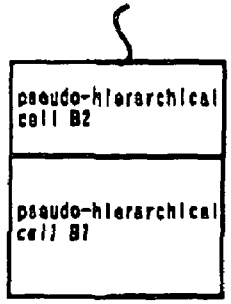
FIG. 11 shows a layout of a pseudo-hierarchical cell B0.
Figure 12:
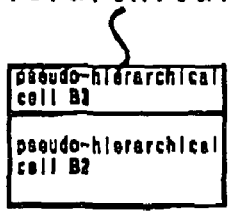
FIG. 12 shows a layout of a pseudo-hierarchical cell B1.
Figure 13:
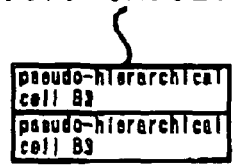
FIG. 13 shows a layout of a pseudo-hierarchical cell B2.
Figure 14:
FIG. 14 shows a layout of a pseudo-hierarchical cell B3.
Figure 15:
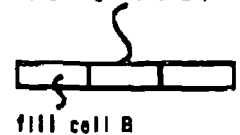
FIG. 15 shows a layout of a pseudo-hierarchical cell B4.

After thus hierarchizing the fill cells in the rectangular region A, that is, grouping these cells into pseudo-hierarchical cells, it is determined at step S18 whether all blank regions have been processed. If no, processing returns to step S13 at which the layout area is scanned to find another unprocessed blank area. Then, a rectangular region is extracted from the found blank area at step S14. For example, the rectangular region B shown in FIG. 3 may be extracted. Then, fill cells are arranged in a grid within the rectangular region B, as shown in FIG. 10. These fill cells have a size equal to the largest size available that fits in the rectangular region B. Then, the arranged fill cells are grouped into pseudo-hierarchical cells according to a predetermined rule to form a hierarchy. Specifically, a top-level pseudo-hierarchical cell B0 is made up of pseudo-hierarchical cells B1 and B2 arranged in the Y-direction, as shown in FIG. 11. Further, the pseudo-hierarchical cell B1 is made up of pseudo-hierarchical cells B2 and B3 arranged in the Y-direction. Further, each pseudo-hierarchical cell B2 is made up of two pseudo-hierarchical cells B3 arranged in the Y-direction, as shown in FIG. 13. Still further, each pseudo-hierarchical cell B3 is made up of two pseudo-hierarchical cells B4 arranged in the Y-direction, as shown in FIG. 14. Lastly, each bottom-level pseudo-hierarchical cell B4 is made up of three fill cells B arranged in the X-direction, as shown in FIG. 15.

Figure 16:
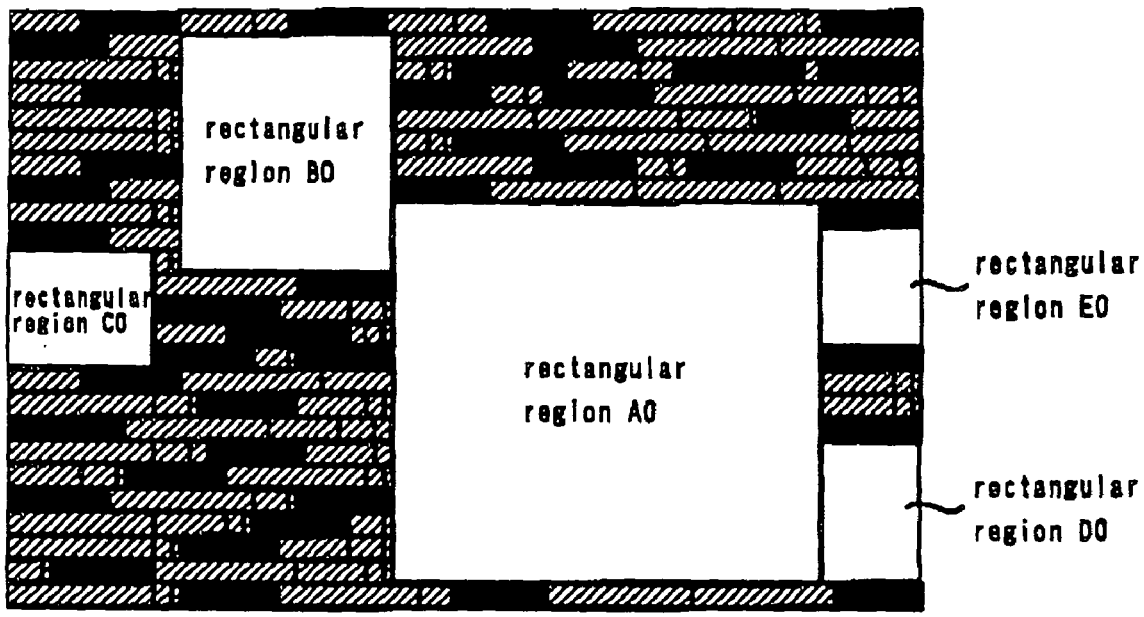
FIG. 16 shows the resultant layout as a result of a pseudo-hierarchy.

Steps S13 to S18 are repeated until no rectangular region can be extracted from any blank area. Then, at step S19, fill cells are arranged in the remaining blank areas, which are smaller than the specified size. FIG. 16 shows the resultant layout in which a pseudo-hierarchy has been established.

After thus arranging fill cells at step S19, the layout is checked at step S20 and it is determined at step S21 whether there is an error in the layout. If no, at step S22 optical proximity effect correction is performed on the semiconductor integrated circuit pattern formed by the above process. If yes, then processing returns to step 11 at which basic logic cells are arranged.

Thus, the present embodiment allows an effective pseudo-hierarchy to be formed in each blank area. This reduces the areas to be subjected to graphics processing, resulting in a reduction in the processing time for optical proximity effect correction.

Second Embodiment

Figure 17:
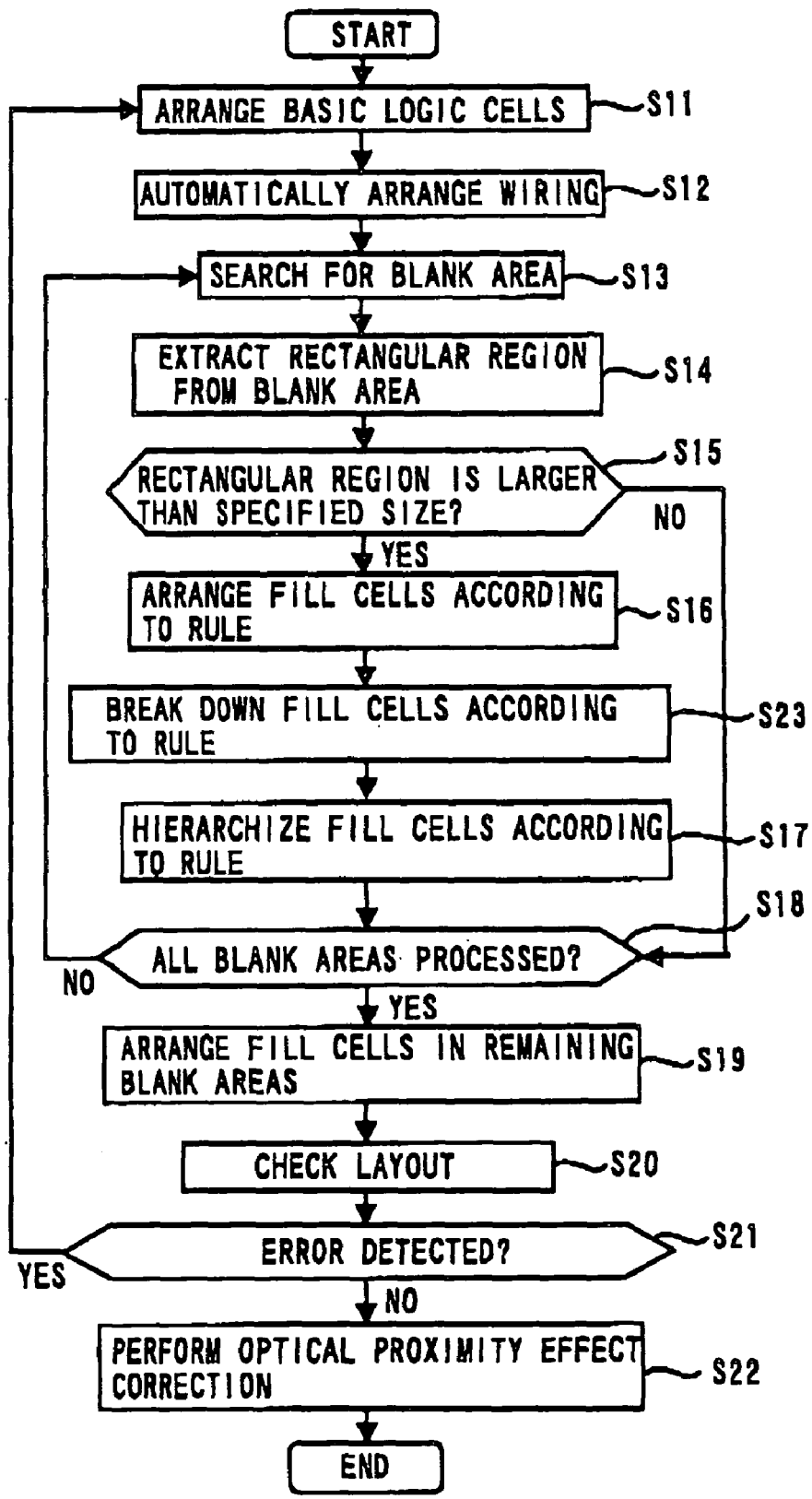
FIG. 17 shows a flowchart illustrating a method for designing a semiconductor integrated circuit layout according to a second embodiment of the present invention.

FIG. 17 shows a flowchart illustrating a method for designing a semiconductor integrated circuit layout according to a second embodiment of the present invention. This flowchart is a variation of the flowchart of the first embodiment in which step S23 is added.

First, as in the first embodiment, basic logic cells are arranged at step S11, wiring is automatically arranged at step S12, and the layout area is scanned to find a blank area at step S13. Then, a rectangular region is extracted from the found blank area at step S14, as in the first embodiment. After that, fill cells are arranged in the extracted rectangular region according to a predetermined rule at step S16.

Then, according to the second embodiment, each arranged fill cell is broken down into, or replaced by, smaller fill cells at step S23. For example, each arranged fill cell may be broken down into, or replaced by, smallest-size fill cells. In this case, the size of the fill cell replaced must be equal to an integer multiple of the size of the replacement fill cells.

Figure 18:
FIG. 18 shows a layout of a pseudo-hierarchical cell A3.

Then, as in the first embodiment, these smaller fill cells are grouped into pseudo-hierarchical cells according to a predetermined rule to form a hierarchy at step S17. Since, at step S23, each arranged fill cell has been broken down into, or replaced by, smaller fill cells or smallest-size fill cells, each pseudo-hierarchical cell A3 above is made up of two pseudo-hierarchical cells B3 arranged in the X-direction, as shown in FIG. 18. This means that some common pseudo-hierarchical cells may be used as intermediate pseudo-hierarchical cells within both the pseudo-hierarchical cells A0 and B0. Such common pseudo-hierarchical cells need be processed only once even when they are used in a plurality of other pseudo-hierarchical cells, thus speeding up the processing.

According to the first embodiment, fill cells arranged in each blank area are selected to be the largest one of those registered in the cell library that fit in the blank area. This means that different types of fill cells may need be arranged in different sized blank areas. On the other hand, arranging smallest-size fill cells in each blank area from scratch takes a long time. To overcome this problem, the second embodiment replaces arranged large fill cells by smaller fill cells. This allows common pseudo-hierarchical cells to be used in a plurality of other pseudo-hierarchical cells, thereby reducing the areas to be processed and hence the processing time for optical proximity effect correction.

Third Embodiment

Figure 19:
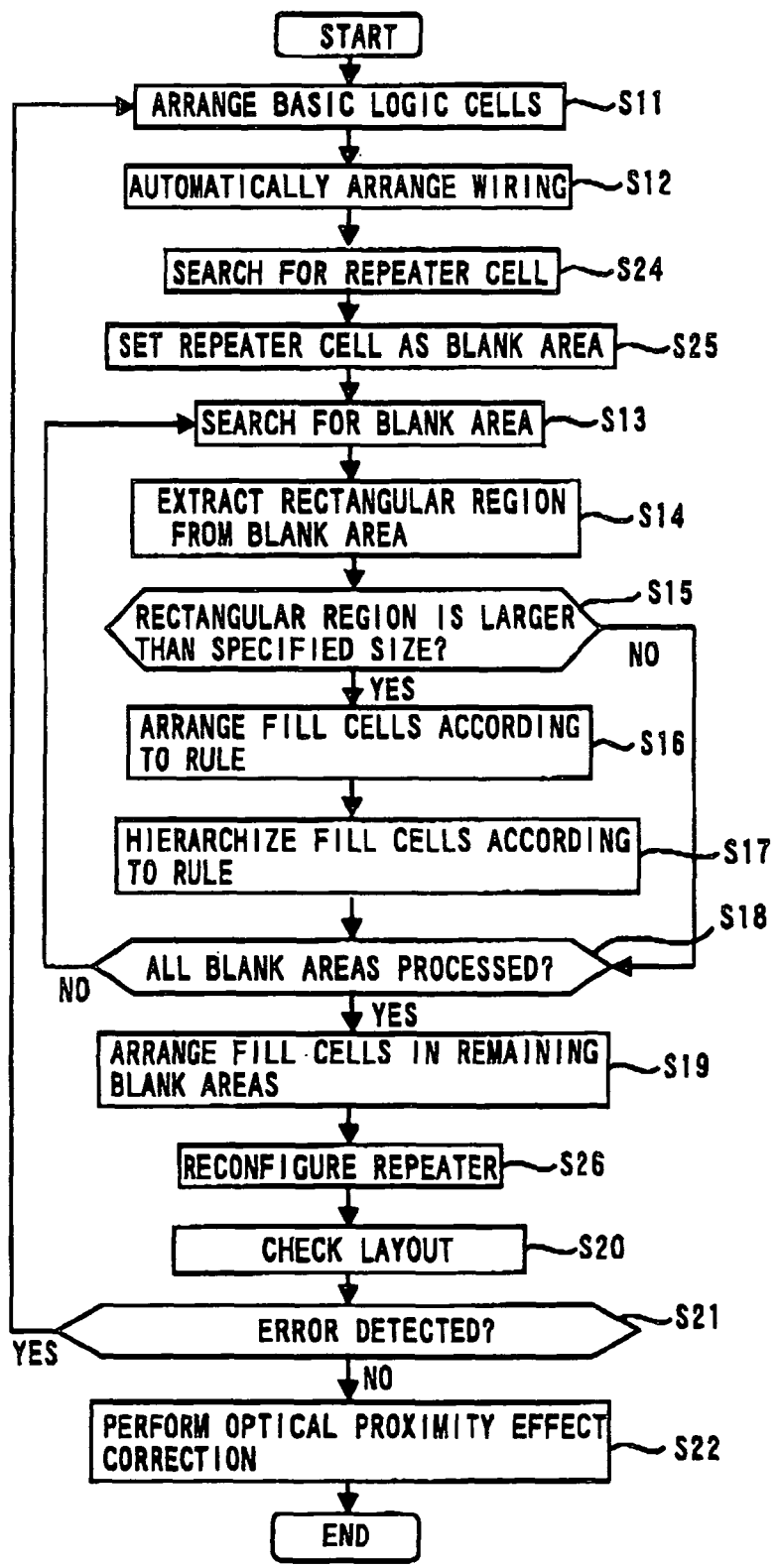
FIG. 19 shows a flowchart illustrating a method for designing a semiconductor integrated circuit layout according to a third embodiment of the present invention.

FIG. 19 shows a flowchart illustrating a method for designing a semiconductor integrated circuit layout according to a third embodiment of the present invention. This flowchart is a variation of the flowchart of the first embodiment in which steps S24, S25, and S26 are added.

Figure 20:
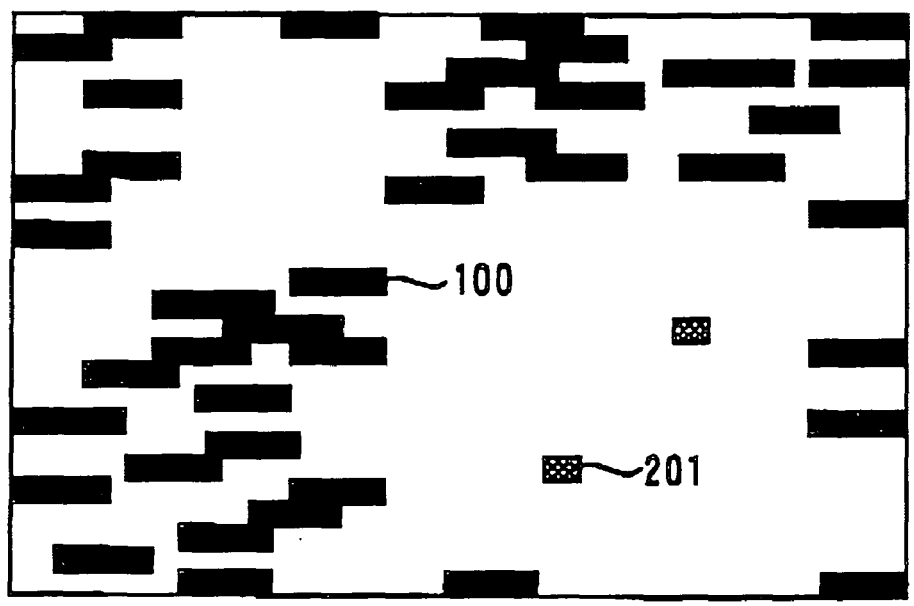
FIG. 20 shows a layout in which basic logic cells are arranged.

First, as in the first embodiment, basic logic cells are arranged at step S11 and wiring is automatically arranged at step S12. Incidentally, in recent years, the wiring resistance and wiring capacity have increased as a result of miniaturization, even though the gate internal delay has decreased. This means that there may be a long delay if the wire length is long. To address this problem, according to the third embodiment, a repeater 201 is set in each long wiring line at the above automatic wiring arrangement step to control delay, as shown in FIG. 20. It should be noted that the repeater is also referred to as "buffer". Such arrangement of repeaters makes it impossible to obtain a large rectangular blank region for speeding up processing, ouch as that described in connection with the first embodiment.

Referring back to FIG. 19, each repeater cell is detected at step S24 and set as a blank area at step S25. Then, as in the first embodiment, the layout area is scanned to find a blank area at step S13, and a rectangular region is extracted from the found blank area at step S14. After that, steps S15 to S19 are performed, as in the first embodiment.

Figure 21:
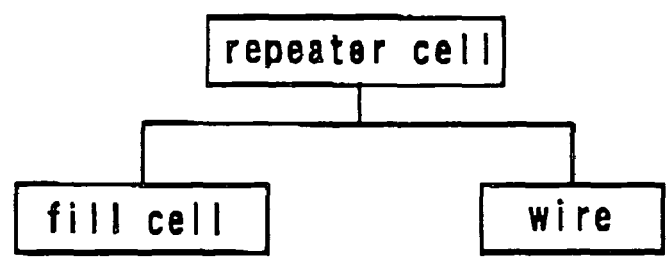
FIG. 21 shows a hierarchical structure of a repeater to be reconfigured.
Figure 22:
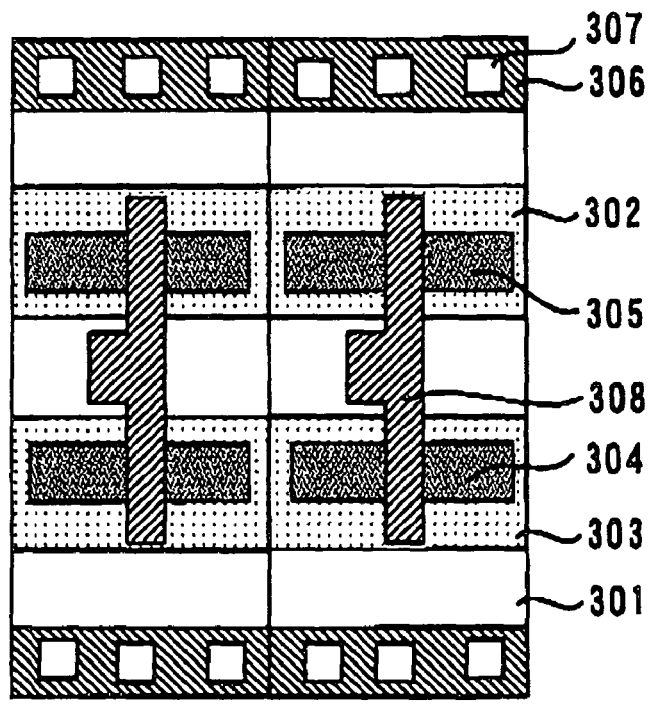
FIG. 22 shows a layout of a fill cell.
Figure 23:
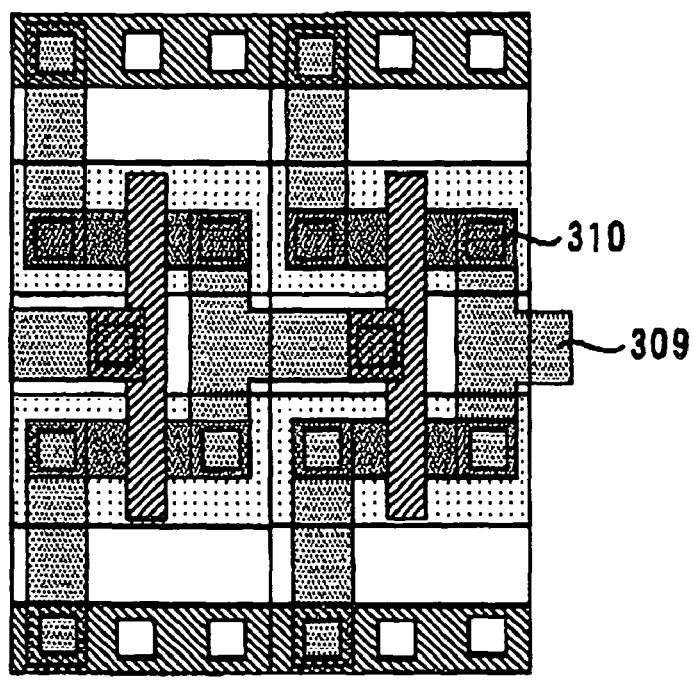
FIG. 23 shows a layout of a wire cell.

Since each repeater overlaps a respective fill cell, at step S26 each repeater is reconfigured by assuming that it is made up of the fill cell and wires lying on the fill cell. FIG. 21 shows the hierarchical structure of a repeater to be reconfigured. This repeater cell is made up of a fill cell and a wire cell. The fill cell includes a P-well 302, an N-well 303, a $P^+$-diffusion layer 304, an $N^+$-diffusion layer 305, a power supply wire 306, contacts 307 and a dummy polysilicon wire 308 all formed on a semiconductor substrate 301, as shown in FIG. 22. The wire cell, on the other hand, includes a wire 309 formed on the interlayer insulating film on the fill cell as shown in FIG. 23. The wire 309 is connected to the underlayer through contacts 307 and additional contacts 310. This wire 309 can be adapted to form a repeater. That is, the fill cell can act as a substrate for forming a repeater thereon.

Then, after arranging fill cells, the layout is checked at step S20 and it is determined at step S21 whether there is an error in the layout, as in the first embodiment. If no, at step S22 optical proximity effect correction is performed on the semiconductor integrated circuit pattern. If yes, then processing returns to step S11 at which basic logic cells are arranged.

As described above, when a repeater is provided in each long wiring line, the present embodiment sets each repeater cell as a blank area. This allows a large rectangular region to be extracted from a blank area, resulting in efficient arrangement of fill cells and hence efficient establishment of a pseudo-hierarchy. Especially, it is possible to reduce the processing time for optical proximity effect correction in the field and gate processes.

Fourth Embodiment

The first to third embodiments provides techniques for arranging fill cells in blank areas formed as a result of arranging basic logic cells in a semiconductor integrated circuit layout. A fourth embodiment of the present invention, on the other hand, relates to arrangement of dummy patterns for automatically arranged wires.

Figure 24:
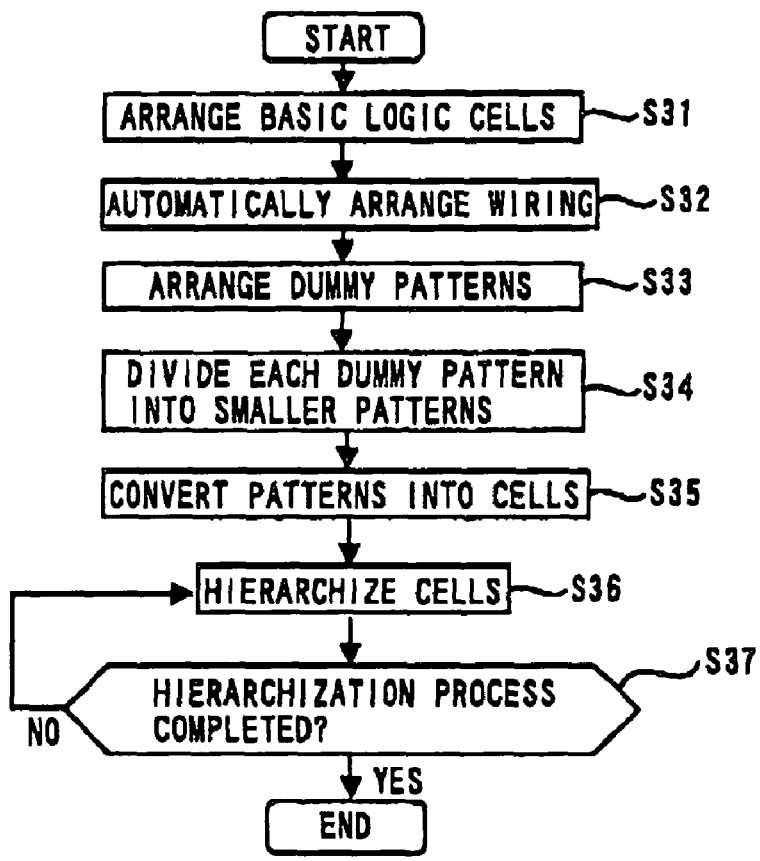
FIG. 24 shows a flowchart illustrating a method for designing a semiconductor integrated circuit layout according to the fourth embodiment of the present invention.

FIG. 24 shows a flowchart illustrating a method for designing a semiconductor integrated circuit layout according to the fourth embodiment of the present invention. First, as in the first embodiment, basic logic cells are arranged at step S31 and wiring is automatically arranged at step S32.

Figure 25:
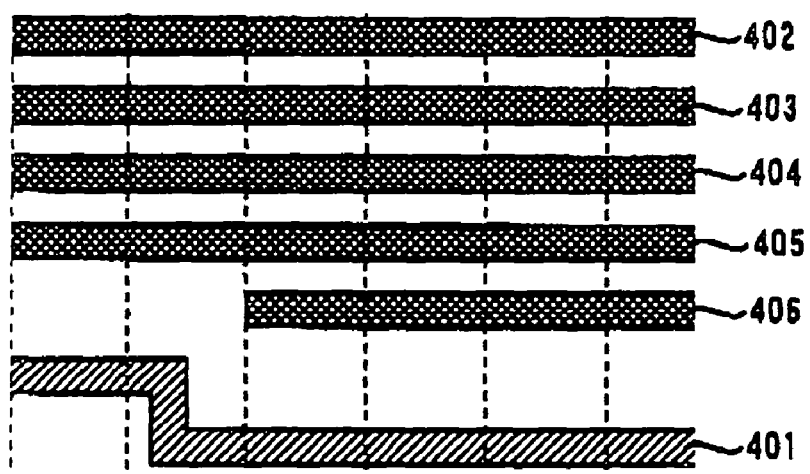
FIG. 25 shows a layout as a result of a division.

Then, dummy patterns 402 to 406 are arranged for a wire 401 according to a layout rule at step S33, as shown in FIG. 25. This layout rule specifies the shape, occupancy ratio, etc. of each dummy pattern arranged. For example, dummy patterns having the same width may be formed at regular intervals.

Then, each dummy pattern is divided according to a dividing rule at step S34. This dividing rule specifies how to divide each dummy pattern according to intervals, width, and etc. For example, each dummy pattern may be divided into equal intervals or smaller patterns. At that time, the wire 401 may be divided together with these dummy patterns.

Figure 26:
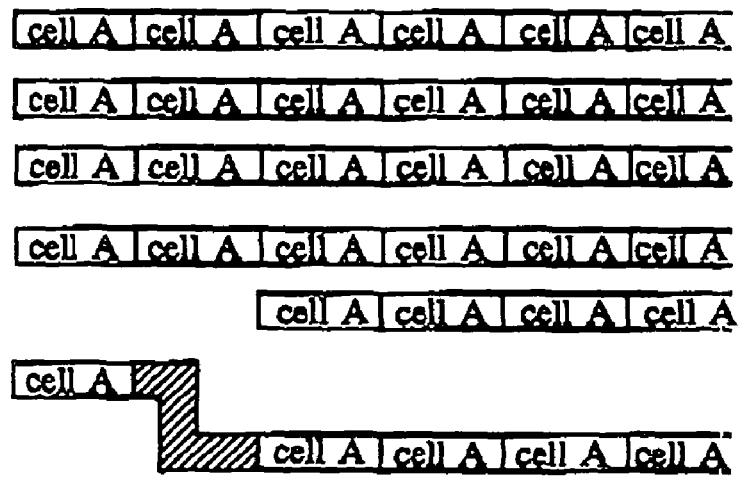
FIG. 26 shows a layout in which smaller patterns obtained as a result of a division are converted into cells.

Then, at step S35, the smaller patterns obtained as a result of the above division are converted into cells according to a rule, as shown in FIG. 26. This rule specifies the shape (width, length) of each pattern. In FIG. 26, each cell A is made up of a pattern having the same shape.

Figure 27:
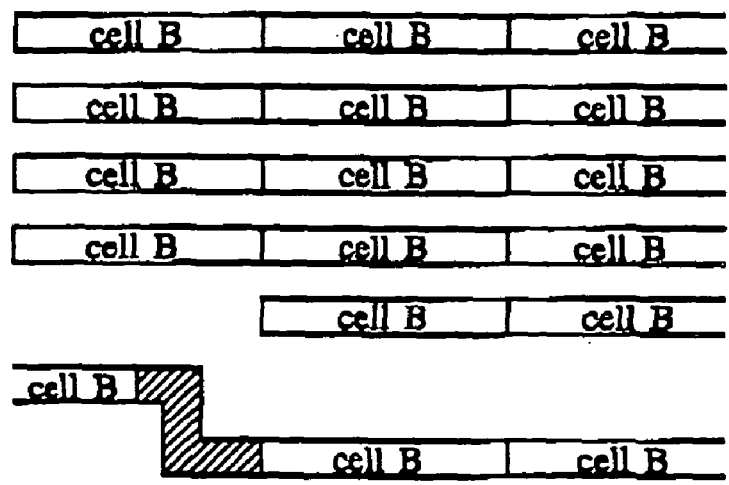
FIG. 27 shows a layout in a hierarchization processing.

Then, these cells are hierarchized according to a rule at step S36. This rule specifies how to group cells in the X- and Y-directions, how to break down cells, etc. In this example, each two adjacent cells A arranged in the X-direction are grouped into a cell B, as shown in FIG. 27.

Figure 28:
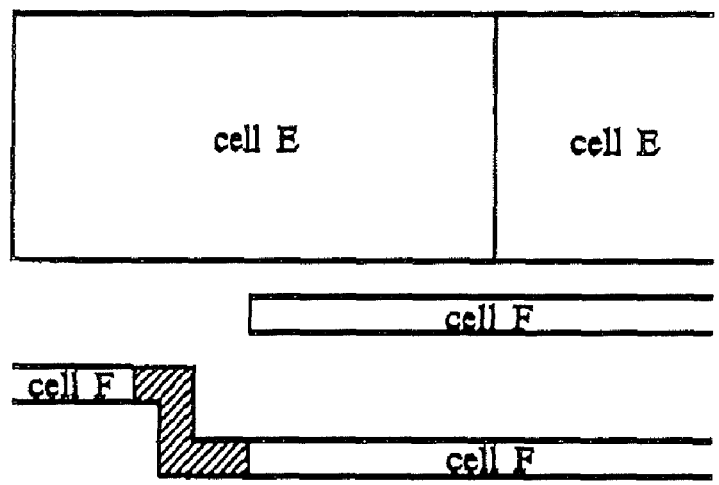
FIG. 28 shows an exemplary layout obtained as a result of a hierarchization processing.
Figure 29:
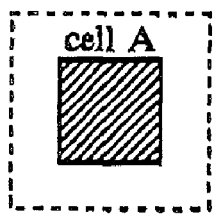
FIG. 29 shows a layout of a cell A.
Figure 30:
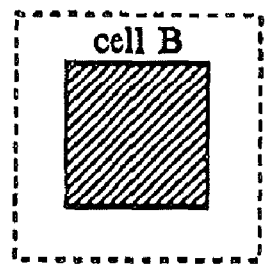
FIG. 30 shows a layout of a cell B.
Figure 31:
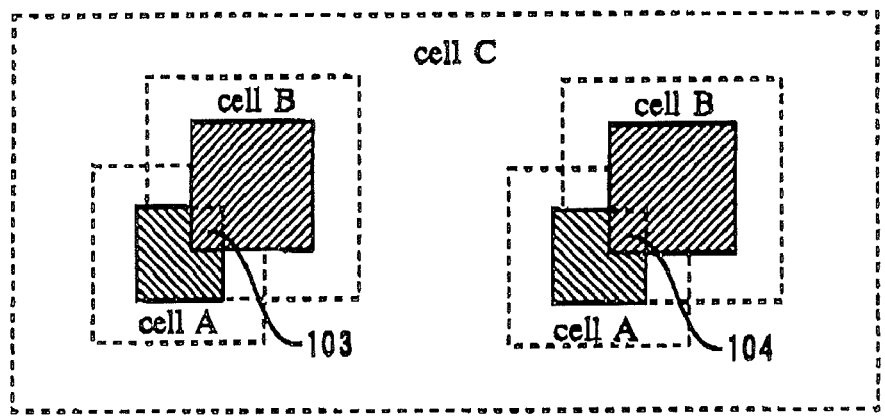
FIG. 31 shows a layout of a cell C.
Figure 32:
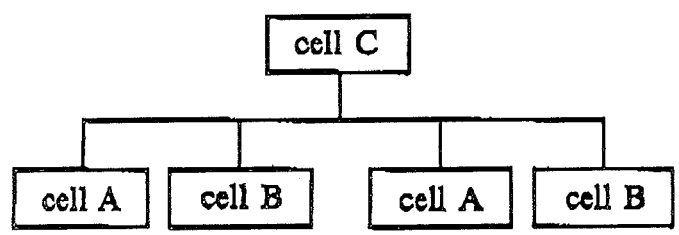
FIG. 32 shows a hierarchical structure formed based on a cell C.
Figure 33:
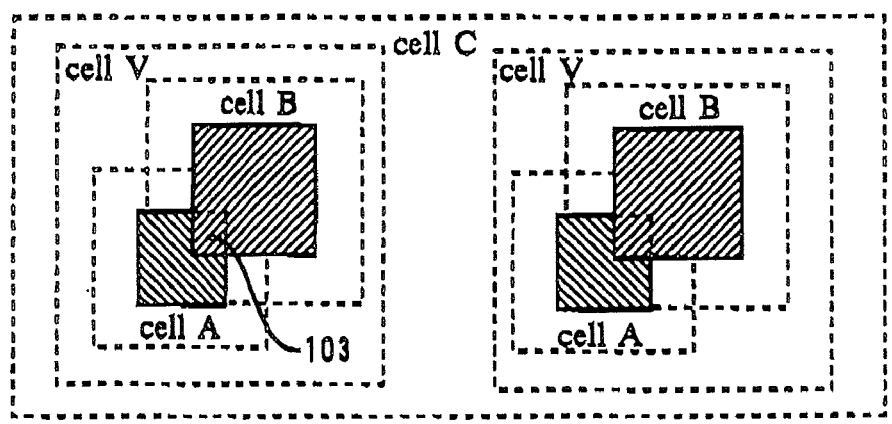
FIG. 33 shows a layout in which actual cells are grouped into pseudo-hierarchical cells.
Figure 34:
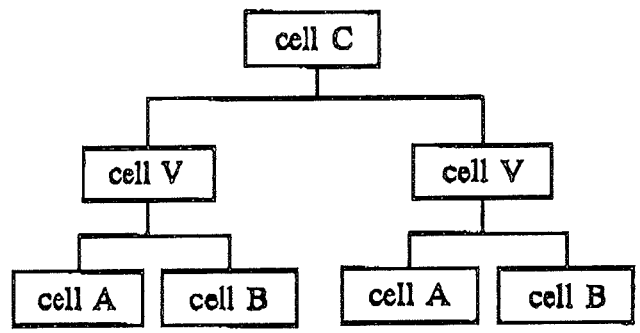
FIG. 34 shows a hierarchical structure formed based on a layout in which actual cells are grouped into pseudo-hierarchical cells.
Figure 35:
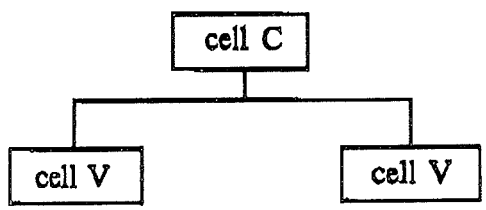
FIG. 35 shows a hierarchical structure in which cells A and B within each pseudo-hierarchical cell are expanded.
Figure 36:
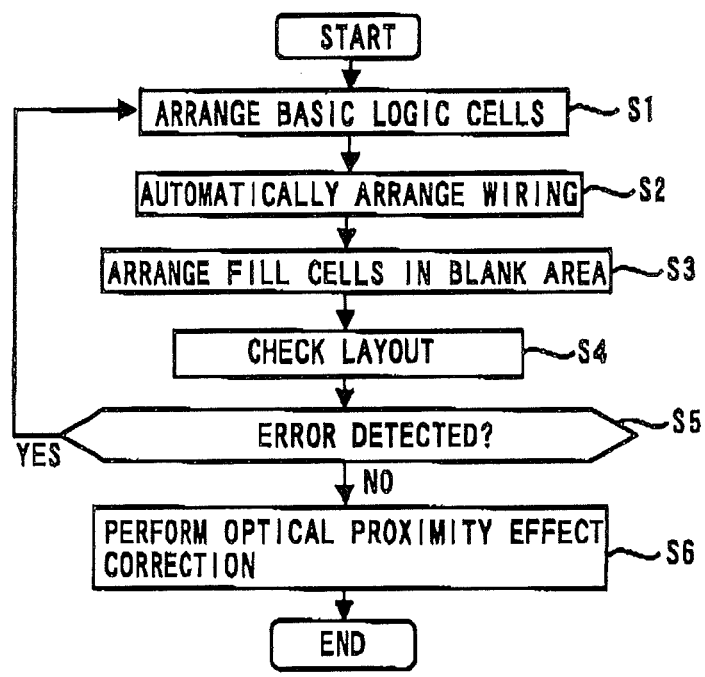
FIG. 36 shows a flowchart illustrating the conventional method for designing a semiconductor integrated circuit layout.
Figure 37:
FIG. 37 shows a layout in which basic logic cells are arranged.
Figure 38:
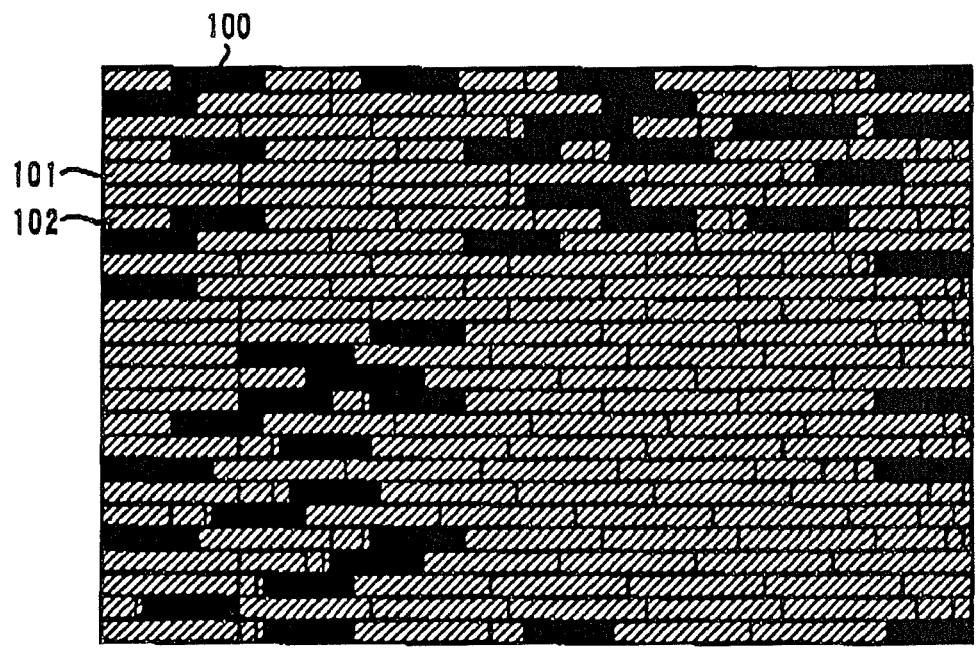
FIG. 38 shows a layout in which fill cells are arranged in blank areas.

Then, at stop S37, it is determined whether the cells can be further hierarchized. If yes, then, for example, cells arranged in the Y-direction may be grouped together. The maximum allowable number of hierarchization operations may be set in some way. FIG. 28 shows an exemplary layout obtained as a result of the above hierarchization processing. Referring to the figure, the layout includes a plurality of cell blocks E and a plurality of cell blocks F, meaning that the method of the present embodiment allows a reduction in the number of figures and areas to be processed. After completion of the hierarchization process, optical proximity effect correction is performed on the semiconductor integrated circuit pattern at step S37.

The above process of converting patterns into cells and forming a cell hierarchy reduces the number of figures and the areas to be subjected to optical proximity effect correction, allowing the processing time for optical proximity effect correction to be reduced.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-205117, filed on Jul. 14, 2005 including specification, claims, drawings and summary, on which the Convention priority of the present application is based, are incorporated herein by reference in its entirety.

What is claimed is:

1. A method for designing a semiconductor integrated circuit layout, comprising the steps of:
    arranging basic logic cells which are circuit patterns corresponding to logic components of a semiconductor integrated circuit;
    automatically arranging, by a computer device, wiring between said basic logic cells;
    searching for a blank area in which none of said basic logic cells is arranged;
    forming a rectangular region in said blank area;
    arranging fill cells in said rectangular region and grouping said fill cells into pseudo-hierarchical cells to form a hierarchy;
    arranging fill cells in the remaining blank areas after each rectangular region is formed; and
    performing optical proximity effect correction on the semiconductor integrated circuit pattern,
    wherein the size of an X-direction of said rectangular region is more than twice the size of a corresponding X-direction of a smallest fill cell among said fill cells, and the size of a Y-direction of said rectangular region is more than twice the size of a corresponding Y-direction of said smallest fill cell.

2. The method for designing a semiconductor integrated circuit layout according to claim 1, wherein said fill cells are broken down into smaller fill cells, and said smaller fill cells are grouped into said pseudo-hierarchical cells to form said hierarchy.

3. The method for designing a semiconductor integrated circuit layout according to claim 1, further comprising the steps of:
    setting a repeater in a long wiring line;
    setting a cell for said repeater as a blank area; and
    reconfiguring said repeater using said fill cells.

4. The method of claim 1, wherein the X-direction is perpendicular to the Y-direction.

5. The method of claim 1, wherein said smallest fill cell is one-half of the size of a larger size fill cell among said fill cells.

6. The method of claim 1, comprising: forming at least two rectangular regions in said blank area, the at least two rectangular regions being of different sizes with respect to each other.

7. The method of claim 1, wherein the each rectangular region includes all rectangular regions extracted from said blank area.

8. A method for designing a semiconductor integrated circuit layout, comprising the steps of:
    arranging basic logic cells which are circuit patterns corresponding to logic components of a semiconductor integrated circuit;
    automatically arranging, by a computer device, wiring between said basic logic cells;
    arranging a dummy pattern into said arranged wiring;
    dividing said dummy pattern and said arranged wiring into smaller patterns and converting said smaller patterns into cells;
    grouping said cells into pseudo-hierarchical cells to form a hierarchy; and
    performing optical proximity effect correction based on the hierarchical relationship of said pseudo-hierarchical cells on the semiconductor integrated circuit pattern.

* * * * *